United States Patent
Medlen et al.

(10) Patent No.: US 6,509,256 B2
(45) Date of Patent: *Jan. 21, 2003

(54) METHODS OF FORMING ELECTRICALLY CONDUCTIVE INTERCONNECTIONS AND ELECTRICALLY INTERCONNECTED SUBSTRATES

(75) Inventors: Curtis M. Medlen, Boise, ID (US); Mark E. Tuttle, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/515,555

(22) Filed: Feb. 29, 2000

(65) Prior Publication Data

US 2002/0058404 A1 May 16, 2002

Related U.S. Application Data

(63) Continuation of application No. 09/022,962, filed on Feb. 12, 1998, now Pat. No. 6,110,760.

(51) Int. Cl.$^7$ ............................ H01L 21/44; H01L 23/48; B23K 31/02
(52) U.S. Cl. ........................ 438/618; 438/108; 438/119; 438/612; 438/613; 438/614; 438/615; 228/115; 228/180.22
(58) Field of Search ................................. 438/106–108, 438/110–112, 63, 119, 612–615, 59, 681; 257/778–781, 785; 228/115, 179.1, 3.1, 4.1, 180.22; 361/DIG. 164, DIG. 80

(56) References Cited

U.S. PATENT DOCUMENTS

| 3,757,075 | A | 9/1973 | Munt |
| 3,893,156 | A | 7/1975 | Riseman |
| 4,157,932 | A | 6/1979 | Hirata |
| 4,442,966 | A | 4/1984 | Jourdain et al. |
| 4,570,329 | A | 2/1986 | Paine et al. |
| 4,612,083 | A | 9/1986 | Yasumoto et al. |

(List continued on next page.)

FOREIGN PATENT DOCUMENTS

| JP | 61-229342 | 10/1986 |
| JP | 62-283644 | 12/1987 |
| JP | 1-120039 | 5/1989 |

Primary Examiner—Olik Chaudhuri
Assistant Examiner—Thanh Nguyen
(74) Attorney, Agent, or Firm—Wells St. John P.S.

(57) ABSTRACT

Methods of forming electrically conductive interconnections and electrically interconnected substrates are described. In one implementation, a first substrate having an outer surface is provided and a layer of material is formed thereover. Openings are formed within the layer of material and conductive masses are formed within the openings. A second substrate having conductive interconnect surfaces is provided. The conductive interconnect surfaces are then contacted with the conductive masses and deformed thereby. In one aspect, the interconnect surfaces are deformed in part by portions of the layer of material proximate the conductive masses. In another aspect, the layer of material is removed and the interconnect surfaces are deformed by the conductive masses themselves.

26 Claims, 6 Drawing Sheets

U.S. PATENT DOCUMENTS

| | | | |
|---|---|---|---|
| 4,818,728 A | | 4/1989 | Rai et al. |
| 4,878,611 A | | 11/1989 | LoVasco et al. |
| 4,998,665 A | | 3/1991 | Hayashi |
| 5,034,799 A | | 7/1991 | Tomita et al. |
| 5,196,371 A | | 3/1993 | Kulesza et al. |
| 5,237,130 A | * | 8/1993 | Kulesza et al. .............. 174/260 |
| 5,279,989 A | | 1/1994 | Kim |
| 5,355,580 A | * | 10/1994 | Tsukada ....................... 29/840 |
| 5,431,328 A | | 7/1995 | Chang et al. |
| 5,488,200 A | * | 1/1996 | Tsukada ..................... 174/261 |
| 5,539,153 A | | 7/1996 | Schwiebert et al. |
| 5,611,140 A | | 3/1997 | Kulesza et al. |
| 5,658,830 A | | 8/1997 | Jeng |
| 5,920,464 A | | 7/1999 | Yokoyama et al. |
| 5,995,188 A | * | 11/1999 | Shimizu et al. .............. 349/147 |
| 6,088,914 A | * | 7/2000 | Variot et al. ................... 29/840 |
| 6,150,255 A | * | 11/2000 | Downes, Jr. et al. ........ 438/613 |
| 6,260,264 B1 | * | 7/2001 | Chen et al. .................. 174/260 |
| 6,306,683 B1 | * | 10/2001 | Dery et al. .................. 438/108 |

\* cited by examiner

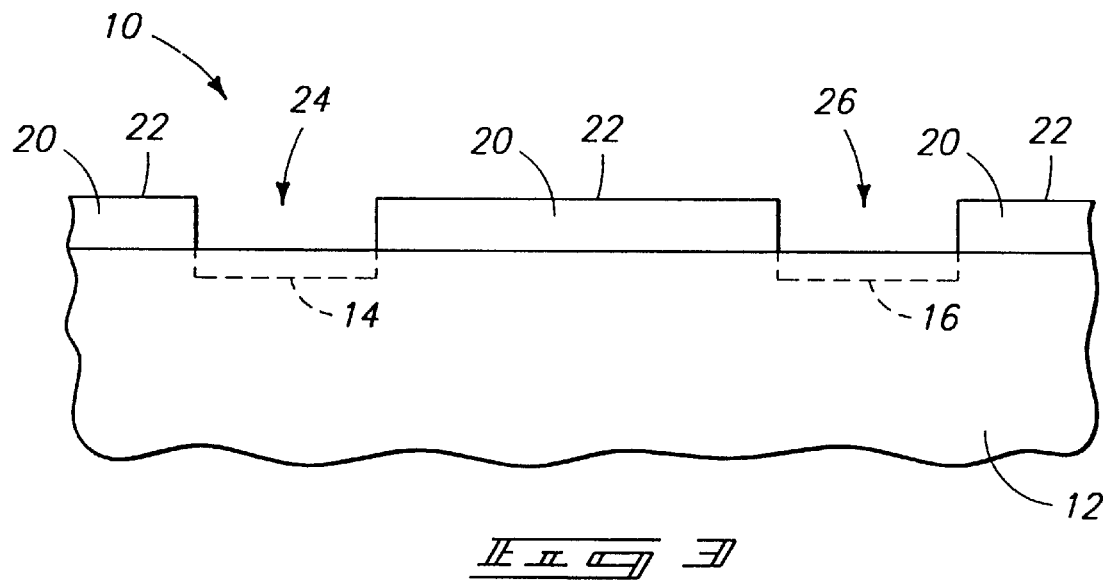
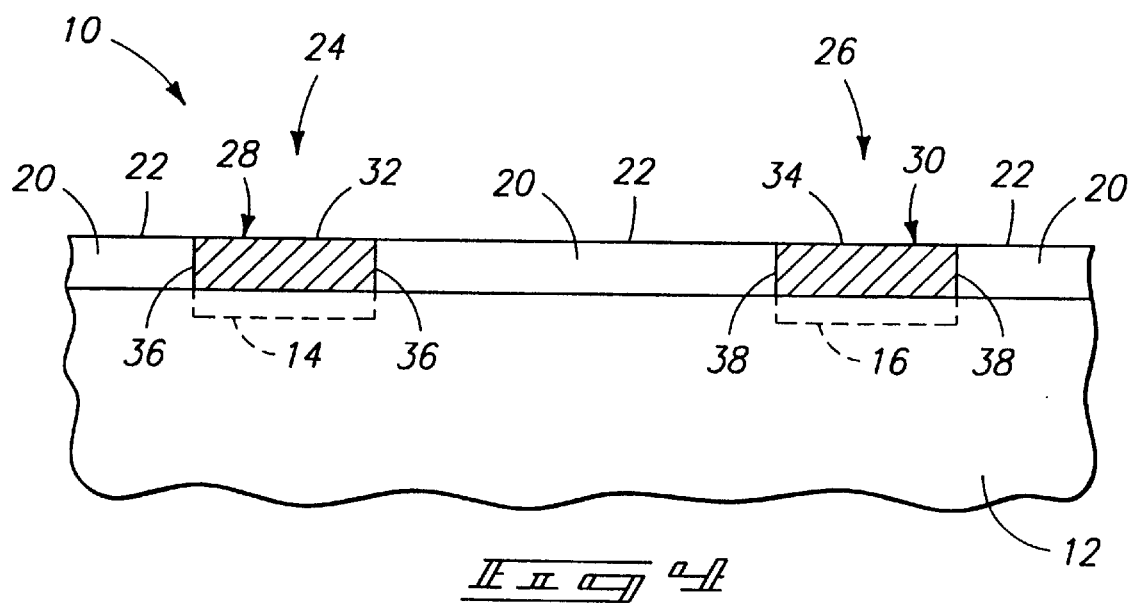

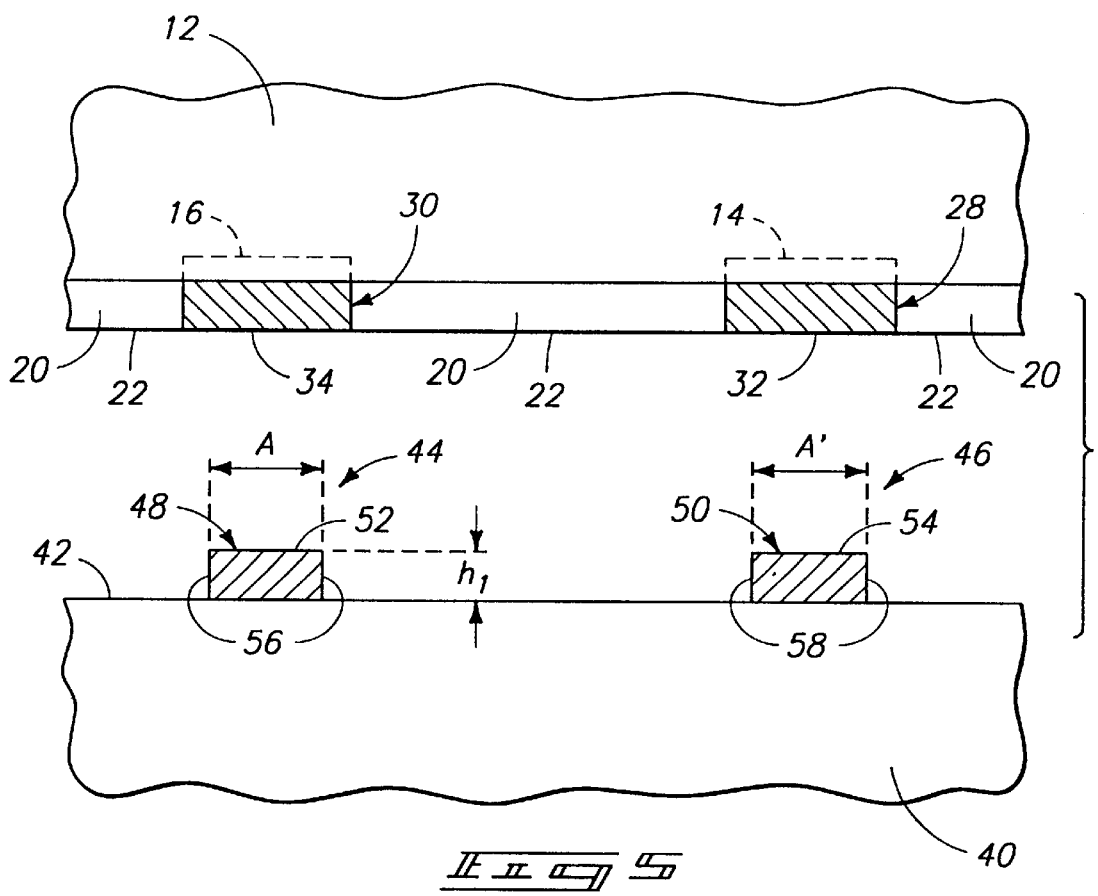
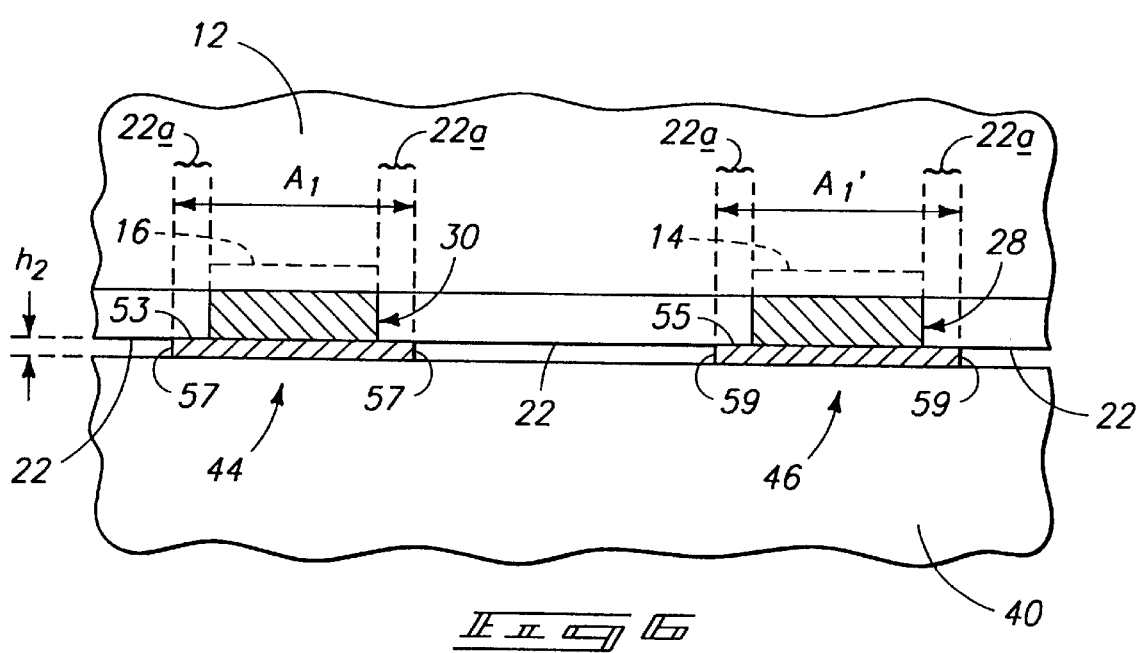

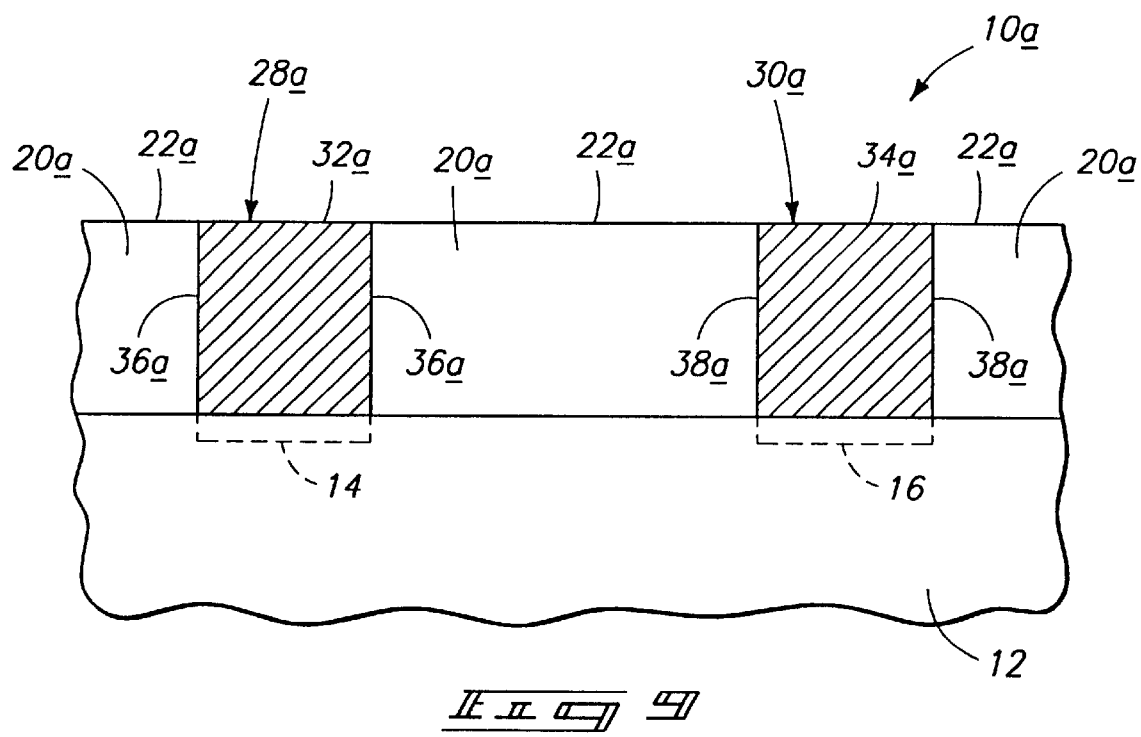
_FIG. 9_
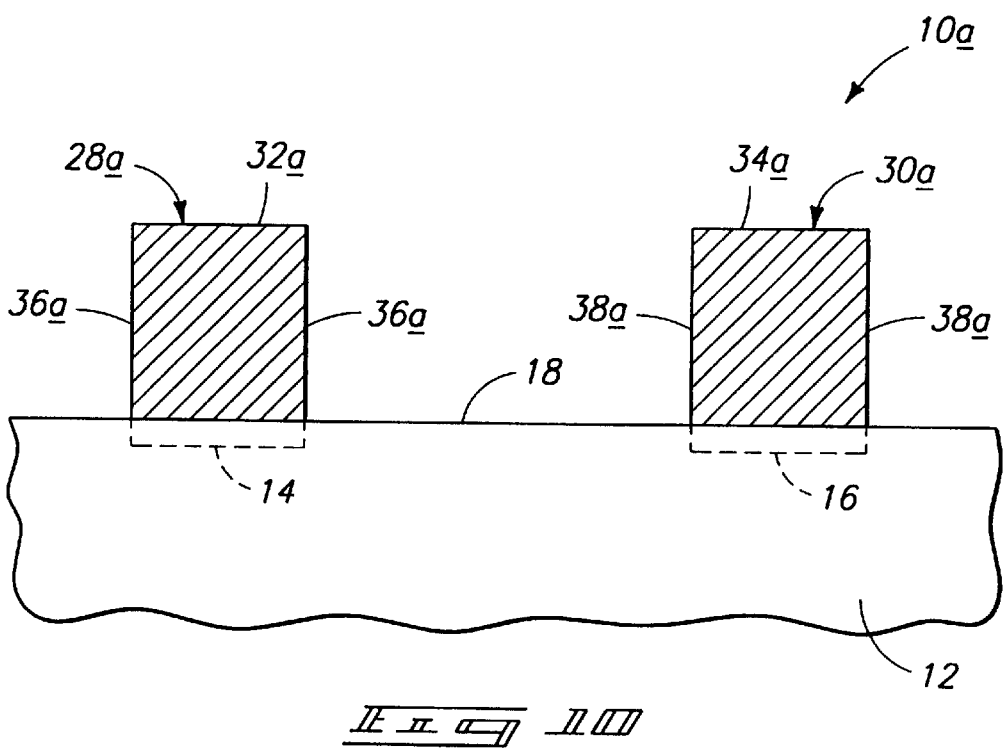
_FIG. 10_

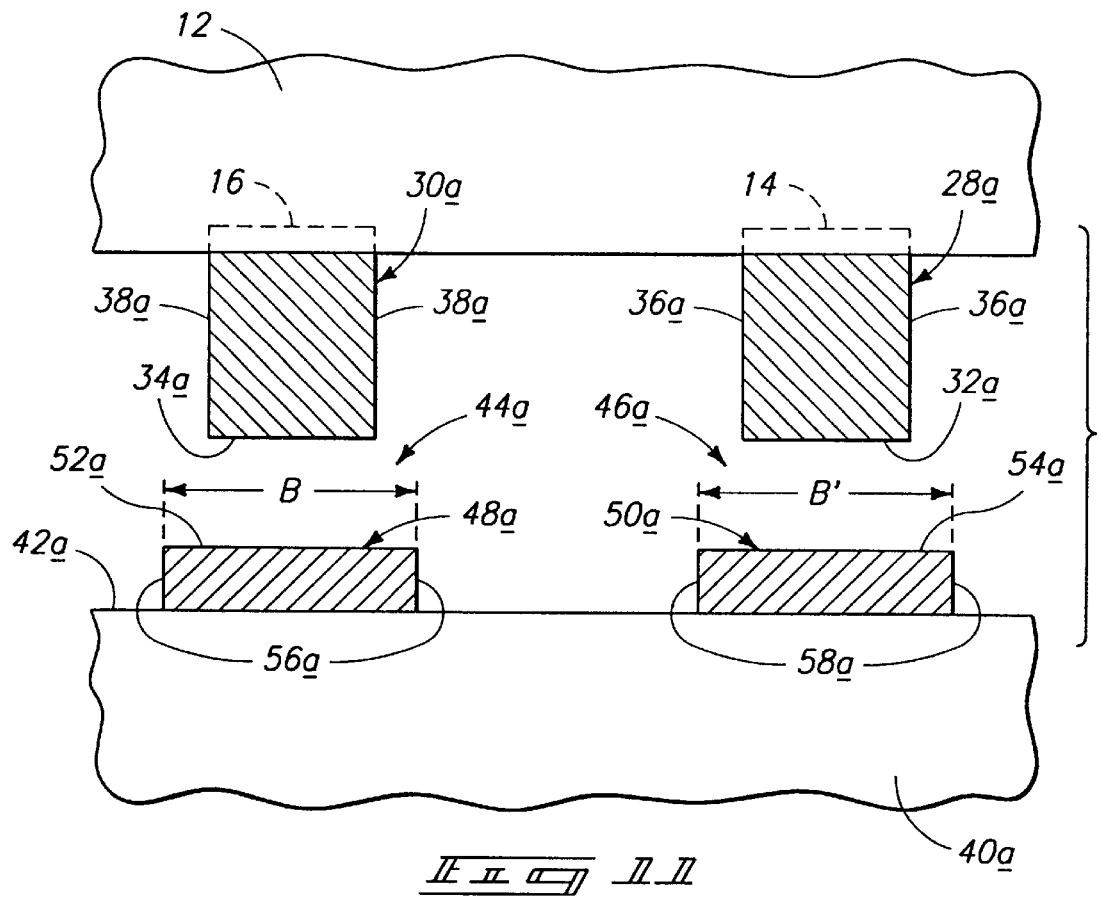
_Fig. 11_
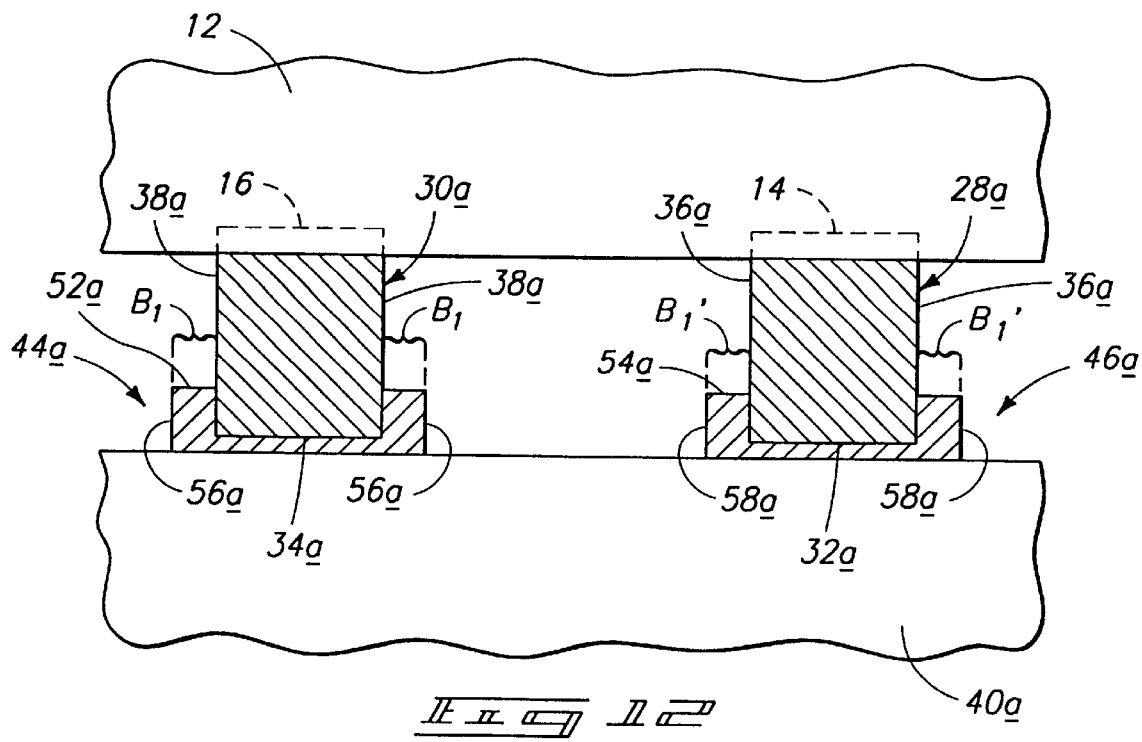
_Fig. 12_

METHODS OF FORMING ELECTRICALLY CONDUCTIVE INTERCONNECTIONS AND ELECTRICALLY INTERCONNECTED SUBSTRATES

CROSS REFERENCE TO RELATED APPLICATION

This is a Continuation of U.S. patent application Ser. No. 09/022,962, filed Feb. 12, 1998, entitled "Methods of Forming Electrically conductive Interconnections and Electrically Interconnected Substrates", now U.S. Pat. No. 6,110,760.

TECHNICAL FIELD

This invention relates to methods of forming electrically conductive interconnections and electrically interconnected substrates.

BACKGROUND OF THE INVENTION

One method of integrated circuit interconnection is called flip chip bonding. Here, bumps of solder or other conductive material are deposited onto conductive pads of a semiconductor wafer or chip. After separation of individual dies from the wafer, the individual dies or chips are turned upside down, and the bumps are properly aligned with a metallization pattern on another substrate. The aligned bumps are then joined to appropriate points on the pattern.

This invention arose out of concerns associated with improving flip chip bonding techniques and the substrates which are interconnected thereby.

SUMMARY OF THE INVENTION

Methods of forming electrically conductive interconnections and electrically interconnected substrates are described. In one implementation, a first substrate having an outer surface is provided and a layer of material is formed thereover. Openings are formed within the layer of material and conductive masses are formed within the openings. A second substrate having conductive interconnect surfaces is provided. The conductive interconnect surfaces are then contacted with the conductive masses and deformed thereby. In one aspect, the interconnect surfaces are deformed in part by portions of the layer of material proximate the conductive masses. In another aspect, the layer of material is removed and the interconnect surfaces are deformed by the conductive masses themselves.

BRIEF DESCRIPTION OF THE DRAWINGS

Preferred embodiments of the invention are described below with reference to the following accompanying drawings.

FIG. 3 is a view of the FIG. 1 wafer fragment at a different processing step.

FIG. 4 is a view of the FIG. 1 wafer fragment at a different processing step.

FIG. 5 is a view of the FIG. 1 wafer fragment at a different processing step.

FIG. 6 is a view of the FIG. 1 wafer fragment at a different processing step.

FIG. 9 is a view of the FIG. 7 wafer fragment at a different processing step.

FIG. 10 is a view of the FIG. 7 wafer fragment at a different processing step.

FIG. 11 is a view of the FIG. 7 wafer fragment at a different processing step.

FIG. 12 is a view of the FIG. 7 wafer fragment at a different processing step.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
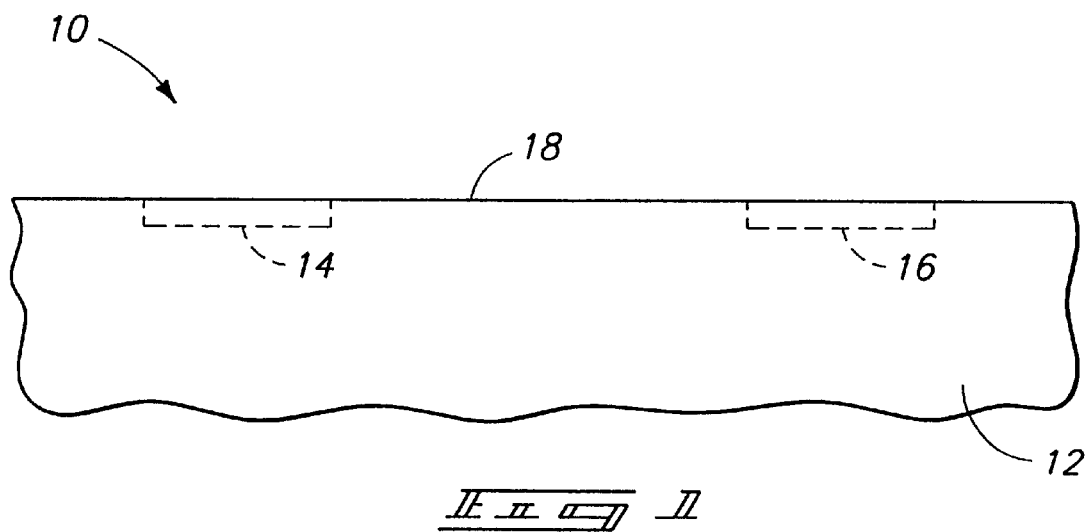
FIG. 1 is a diagrammatic sectional view of a semiconductor wafer fragment undergoing processing in accordance with one implementation of the invention.

Referring to FIG. 1, a semiconductor wafer fragment is shown generally at 10 and comprises a semiconductive substrate 12 which supports integrated circuitry which is not specifically shown. A pair of integrated circuitry bond pads 14, 16 are formed within and supported by substrate 12. The illustrated bond pads are disposed below a substrate outer surface 18. For purposes of the ongoing discussion, substrate 12 constitutes a first substrate.

Figure 2:
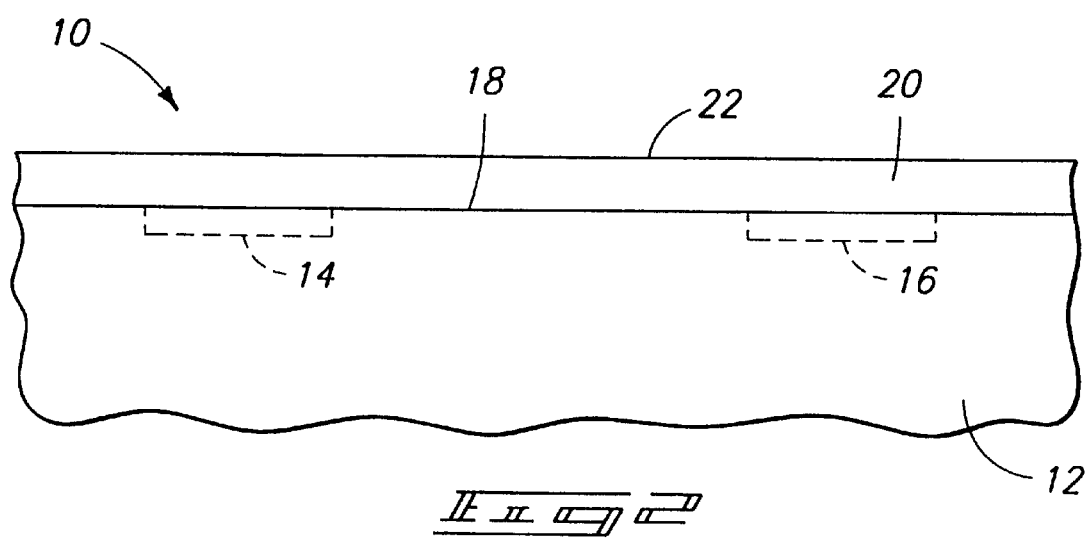
FIG. 2 is a view of the FIG. 1 wafer fragment at a different processing step.

Referring to FIG. 2, a layer of material 20 is formed over outer surface 18 and bond pads 14, 16. The illustrated layer has a generally planar outer surface 22. Exemplary materials for layer 20 include insulative materials and/or photoresist. Layer 20 is formed to a height over outer surface 18 which is a desired height for conductive masses which are to be subsequently formed. An exemplary height is between about 10–30 $\mu$m.

Referring to FIG. 3, portions of layer 20 are removed thereby forming openings 24, 26 and outwardly exposing selected substrate portions which include respective bond pads 14, 16. If layer 20 is photoresist, it would simply be patterned and portions removed in accordance with conventional photoresist processing. If layer 20 is a material other than photoresist, it would be patterned and etched accordingly.

Referring to FIG. 4, conductive material is provided into the openings and forms respective conductive masses 28, 30 received within layer 20. The conductive material replaces the portions of layer 20 which were removed to form openings 24, 26. In one aspect, the conductive material which comprises each mass is homogeneously distributed within layer 20 sufficiently to fill the respective openings. To achieve adequate filling of the openings, a non-solidified conductive material such as a silver-filled polymer epoxy material can be used. Exemplary methods for filling openings 24, 26 include stencil printing and screen printing. In addition, conductive material can be deposited into the openings and over the substrate and subsequently planarized as by chemical-mechanical or other polishing. If necessary, the substrate can be exposed to conditions, such as curing conditions, which are effective to harden the conductive material within openings 24, 26.

The illustrated masses have outermost surfaces which include respectively, outwardly exposed uppermost surface portions 32, 34 and sidewalls or sidewall portions 36, 38. Uppermost surface portions 32, 34 are generally planar and coplanar with proximate portions of outer surface 22. The individual sidewall portions for each mass face generally oppositely one another and extend generally transversely away from the substrate where each joins therewith.

Referring to FIG. 5, substrate 12 is inverted or flipped over a second substrate 40. Second substrate 40 includes an outer surface 42. A pair of conductive structures 44, 46 are formed over substrate 40 and comprise respective conductive interconnect surfaces 48, 50. The interconnect surface of each structure defines a respective shape which extends away from outer surface 42 and includes respective uppermost surfaces 52, 54. The uppermost surfaces face generally away from substrate 40 and join with respective sidewalls 56, 58. Structures 44, 46 have a surface area consisting of a first portion which makes physical contact with outer surface 42. The first portion corresponds to that portion of a structure's surface area which is disposed atop and in physical contact with substrate 40. The structures also include a second portion which does not make physical contact with substrate 40. Such second portions include first surface areas A, A' which are defined by uppermost surfaces 52, 54 respectively and sidewalls 56, 58. The second portions are substantially outwardly exposed. The uppermost surfaces also define respective first heights $h_1$ over outer surface 42. In one aspect, structures 44, 46 comprise homogeneously distributed conductive material.

Referring to FIG. 6, the substrates are moved toward one another and the respective interconnect surfaces 48, 50 (FIG. 5) are physically contacted with the outermost surfaces of respective masses 30, 28. Such moving changes the shapes of conductive structures 44, 46 and accordingly deforms interconnect surfaces 48, 50. In the illustrated example, the conductive structures are squeezed between the first and second substrates. This generally flattens the structures relative to the structures' shapes. Portions 22a of outer surface 22 also engage the conductive structures to effect the deformation thereof. Such deformation effectively defines different respective uppermost surfaces 53, 55, and different sidewalls 57, 59. Uppermost surfaces 53, 55 respectively define different second surface areas $A_1$, $A_1'$ which are greater than first surface areas A, A' respectively. Accordingly, uppermost surfaces 53, 55 define respective second heights $h_2$ which are less than first heights $h_1$.

Figure 7:
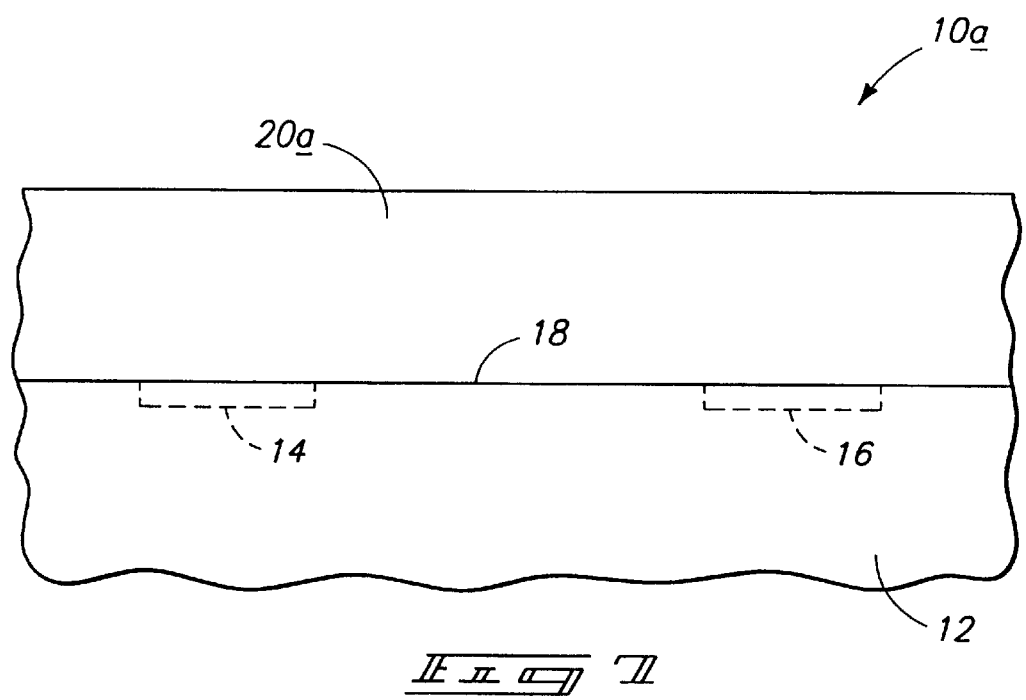
FIG. 7 is a view of the FIG. 1 wafer fragment undergoing processing in accordance with another implementation of the invention.

Referring to FIG. 7, an alternate embodiment is set forth generally at 10a. Like numerals from the above-described embodiment have been utilized where appropriate, with differences being indicated by the suffix "a" or with different numerals. Accordingly, a layer of material 20a is formed over first substrate 12. Layer 20a can be formed to a height from between about 100 µm to 200 µm.

Figure 8:
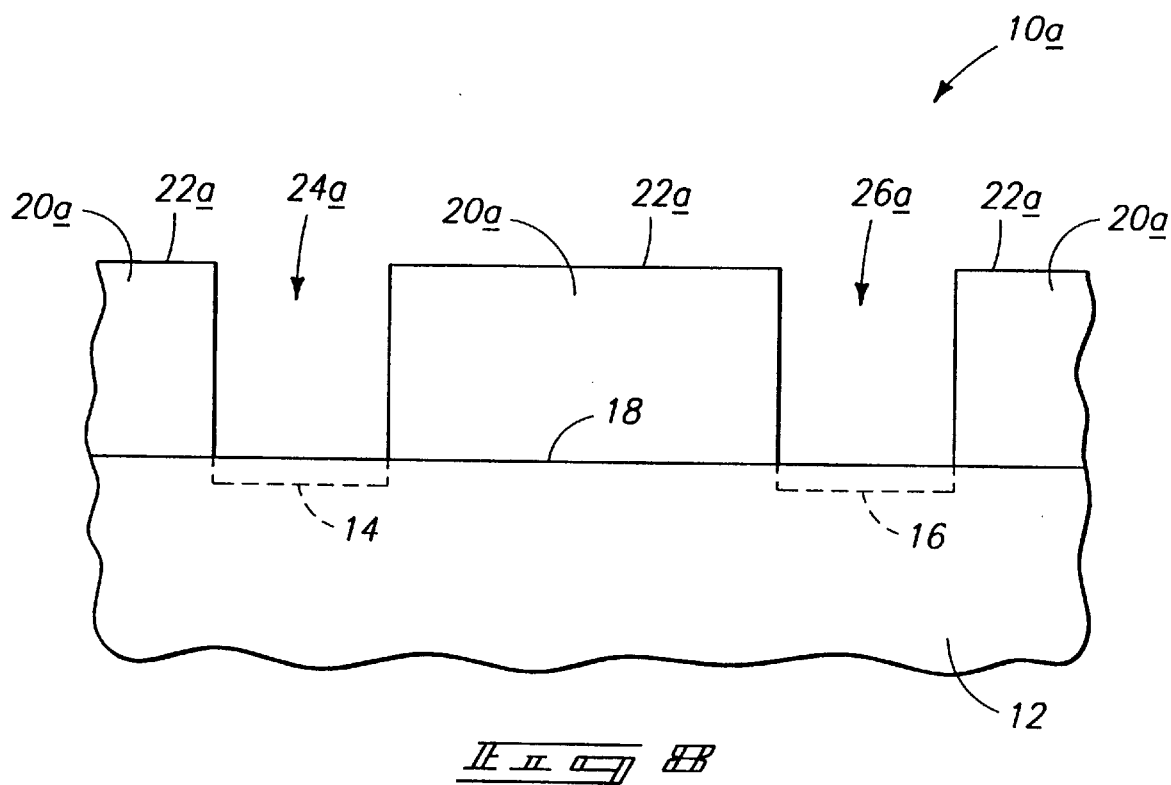
FIG. 8 is a view of the FIG. 7 wafer fragment at a different processing step.

Referring to FIG. 8, openings 24a, 26a are formed in layer 20a and outwardly expose bond pads 14, 16.

Referring to FIG. 9, conductive masses 28a, 30a are formed over substrate 12 and received within layer 20a. Accordingly, the masses have respective heights which are defined by each masses' vertically extending sidewalls 36a, 38a which are substantially the same as the height of layer 20a, e.g., between about 100 µm to 200 µm.

Referring to FIG. 10, material of layer 20a is removed sufficiently to leave masses 28a, 30a over substrate 12. Layer 20a can be removed through conventional techniques such as resist stripping (when photoresist is used) or through a selective etch of the layer relative to material of both the masses and the outer surface of substrate 12.

Referring to FIG. 11, a second substrate 40a is provided with conductive structures 44a, 46a thereover. The conductive structures include uppermost surfaces 52a, 54a which define respective surface areas B, B'.

Referring to FIG. 12, substrates 12 and 40a are moved toward each other and masses 30a, 28a are respectively extended into and deform conductive structures 44a, 46a. The masses are extended into the respective structures to below the uppermost surfaces 52a, 54a thereof a distance which is less than the respective height of each mass.

The uppermost surface 34a, 32a of each mass is disposed closer to the second substrate than some portions of sidewalls 56a, 58a. Accordingly, the respective structures are bonded with the uppermost surface 52a, 54a of each mass, as well as a portion of at least one of the sidewalls of each mass. In the illustrated example, portions of each sidewall of each mass are bonded with the respective conductive structures. Accordingly, less than all of each mass sidewall has conductive material of an associated conductive structure disposed laterally adjacent thereto and is disposed laterally between respective structure sidewalls 56a, 58a. The portions of each mass which are not disposed within the conductive structures are disposed elevationally over those portions which are disposed within the conductive structures.

Each conductive structure 44a, 46a is deformed by and through the engagement with the respective conductive interconnect surfaces of the conductive masses. Accordingly, such defines respective second surface areas $B_1$ (for conductive structure 44a) and $B_1'$ (for conductive structure 46a) which are less than the respective first surface areas B, B' in FIG. 11.

The above-described embodiments provide flip chip bonding methods which improve upon techniques which are currently utilized. Material of layers 20, 20a is easily formed through commonly-employed techniques and formation of the masses therewithin is thought to be much simpler and more cost effective than current methods. In addition, desirable epoxy connections can be achieved without significant additional capacitance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrically conductive interconnection comprising:

forming a layer of material over an outer surface of a first substrate;

providing a conductive interconnect surface disposed on a second substrate;

forming a conductive mass within the layer of material, the conductive mass having an outermost surface which is generally coplanar with an outer surface of the layer;

physically contacting the conductive interconnect surface with the conductive mass outermost surface; and deforming the conductive interconnect surface with the conductive mass outermost surface.

2. The method of claim 1, wherein providing the conductive interconnect surface comprises providing the conductive interconnect surface having a planar uppermost surface and wherein deforming comprises engaging the uppermost surface with at least a portion of the outer surface of the conductive mass.

3. The method of claim 2, wherein providing the conductive interconnect surface comprises forming an uppermost surface of a conductive structure on the second substrate and wherein deforming comprises extending the conductive mass into the uppermost surface and below at least a portion thereof.

4. The method of claim 2, wherein providing the conductive interconnect surface comprises providing the conductive interconnect surface wherein the planar uppermost surface defines a first surface area prior to the engaging thereof and a second surface area after the engaging thereof, the second surface area being greater than the first surface area.

5. The method of claim 2, further comprising removing the layer of material.

6. The method of claim 5, wherein removing comprises selectively etching the layer of material relative to both the conductive mass and material of the first substrate outer surface.

7. The method of claim 1, wherein forming the conductive mass comprises:
   forming an opening in the layer of material; and
   filling the opening with conductive material.

8. The method of claim 7, wherein filling the opening comprises stencil printing the conductive material into the opening.

9. The method of claim 7, wherein filling the opening comprises screen printing the conductive material into the opening.

10. The method of claim 7, wherein filling the opening comprises:
    forming conductive material over the planar outer surface of the layer of material; and
    planarizing the conductive material relative to the layer of material.

11. A method of forming an electrically conductive interconnection comprising:
    forming a layer of material over an outer surface of a first substrate;
    forming a non-solidified conductive material within openings in the layer of material;
    hardening the conductive material to form masses of conductive material within respective openings, at least one of the masses having a generally planar outermost surface;
    providing a conductive structure disposed on a surface of a second substrate, the conductive structure having an uppermost surface defining a first conductive structure surface area;
    engaging the uppermost surface with the planar outermost surface of the one mass; and
    deforming at least a portion of the conductive structure with the planar outermost surface sufficient to define a second conductive structure surface area different from the first conductive structure surface area.

12. The method of claim 11, wherein forming the non-solidified conductive material within openings comprises forming a generally homogeneous conductive material within openings in the layer of material.

13. The method of claim 11, wherein deforming comprises deforming the portion to define the second conductive structure surface area to be greater than the first conductive structure outermost surface area.

14. The method of claim 11, wherein deforming comprises deforming the portion to define the second conductive structure surface area to be less than the first conductive structure outermost surface area.

15. The method of claim 11, wherein hardening the conductive material to form masses of conductive material forms conductive structures each having a first height over the surface of the second substrate outer surface, and wherein, subsequent to engaging, the conductive structures each define a second height less than the first height over the second substrate outer surface.

16. The method of claim 11, wherein hardening the conductive material defines the generally planar outermost surface of the one mass to be coplanar with an outer surface of the layer of material.

17. The method of claim 16, wherein engaging comprises engaging the uppermost surface with at least a portion of the outer surface of the planar outermost surface of the one mass, wherein the one mass comprises silver-filled epoxy.

18. The method of claim 1, wherein providing a second substrate having a conductive interconnect surface comprises providing a second substrate having a conductive epoxy interconnect surface.

19. The method of claim 1, wherein deforming the conductive interconnect surface comprises squeezing the conductive mass of material into the conductive structure.

20. The method of claim 1, wherein providing a conductive interconnect surface comprises providing a second substrate having a non-solidified conductive interconnect surface.

21. The method of claim 1, wherein providing a second substrate having a conductive interconnect surface comprises providing a second substrate having a conductive silver-filled polymer interconnect surface.

22. The method of claim 11, wherein providing a second substrate having a homogeneous conductive structure disposed thereover comprises providing a second substrate having a silver-filled polymer conductive structure disposed thereover.

23. The method of claim 11, wherein providing a second substrate having a homogeneous conductive structure disposed thereover comprises providing a second substrate having conductive epoxy disposed thereover.

24. A method of forming an electrically conductive interconnection comprising:
    providing a first substrate having an outer surface;
    providing a second substrate having a non-solidified conductive epoxy interconnect surface;
    forming a layer of material over the first substrate outer surface;
    after forming the layer of material over the first substrate outer surface, forming a conductive mass of homogeneously distributed material within the layer of material, the layer of material having a substantially planar outer surface proximate the conductive mass, the conductive mass having an outermost surface which is generally coplanar with said outer surface of the layer; and
    physically contacting the conductive interconnect surface on the second substrate with the conductive mass outermost surface and physically deforming the conductive interconnect surface with the conductive mass outermost surface by squeezing the conductive mass of material into the conductive structure.

25. A method of forming an electrically conductive interconnection comprising:

providing a first substrate having an outer surface;

providing a second substrate having a non-solidified conductive silver-filled polymer interconnect surface;

forming a layer of material over the first substrate outer surface;

after forming the layer of material over the first substrate outer surface, forming a conductive mass of homogeneously distributed material within the layer of material, the layer of material having a substantially planar outer surface proximate the conductive mass, the conductive mass having an outermost surface which is generally coplanar with said outer surface of the layer; and physically contacting the conductive interconnect surface on the second substrate with the conductive mass outermost surface and physically deforming the conductive interconnect surface with the conductive mass outermost surface by squeezing the conductive mass of material into the conductive structure.

26. A method of forming an electrically conductive interconnection comprising:

providing a first substrate having an outer surface;

forming a layer of material over the outer surface;

forming openings through the layer of material and exposing selected outer surface portions;

forming a non-solidified conductive material within the openings and exposing the first substrate to conditions effective to harden the conductive material and form masses of conductive material within the respective openings, at least one of the masses having a generally planar, outwardly exposed outermost surface;

providing a second substrate having a homogeneous conductive structure disposed thereover, the homogeneous conductive structure having an outwardly exposed uppermost surface which faces generally away from the second substrate and defines a first conductive structure surface area, the homogeneous conductive structure including a material selected from the group including non-solidified conductive epoxy and non-solidified conductive silver-filled polymer;

engaging the conductive structure's uppermost surface with the planar outermost surface of the one mass; and deforming at least a portion of the conductive structure with the planar outermost surface sufficient to define a second conductive structure surface area which is substantially different from the first conductive structure surface area.

* * * * *